United States Patent [19]

Javanifard et al.

[11] Patent Number: 5,442,586
[45] Date of Patent: Aug. 15, 1995

[54] METHOD AND APPARATUS FOR CONTROLLING THE OUTPUT CURRENT PROVIDED BY A CHARGE PUMP CIRCUIT

[75] Inventors: Jahanshir J. Javanifard, Sacramento; Albert Fazio, Los Gatos; Robert E. Larsen, Shingle Springs; James Brennan, Jr., Saratoga; Kerry D. Tedrow, Orangevale, all of Calif.

[73] Assignee: Intel Corporation, Santa Clara, Calif.

[21] Appl. No.: 119,425

[22] Filed: Sep. 10, 1993

[51] Int. Cl.⁶ ............................................. G11C 16/06
[52] U.S. Cl. .................. 365/185; 365/189.09; 365/218; 365/226; 365/900
[58] Field of Search ............... 365/185, 218, 900, 226, 365/189.09

[56] References Cited

U.S. PATENT DOCUMENTS

| | | | |
|---|---|---|---|
| 5,077,691 | 12/1991 | Haddad et al. | 365/185 |
| 5,153,854 | 10/1992 | Herold . | |
| 5,157,278 | 10/1992 | Min et al. . | |
| 5,216,588 | 6/1993 | Bajwa et al. . | |
| 5,243,561 | 9/1993 | Yamauchi | 365/218 |
| 5,245,572 | 9/1993 | Kosonocky et al. . | |
| 5,267,196 | 11/1993 | Talreja et al. | 365/185 |
| 5,267,218 | 11/1993 | Elbert . | |
| 5,276,646 | 1/1994 | Kim et al. . | |
| 5,280,447 | 1/1994 | Hazen et al. | 365/218 |
| 5,287,317 | 2/1994 | Kobayashi et al. | 365/218 |
| 5,297,096 | 3/1994 | Terada et al. | 365/218 |
| 5,313,429 | 5/1994 | Chevallier et al. | 365/218 |
| 5,315,547 | 5/1994 | Shoji et al. | 365/185 |
| 5,317,535 | 5/1994 | Talreja et al. | 365/185 |
| 5,327,384 | 7/1994 | Ninomiya | 365/218 |
| 5,329,488 | 7/1994 | Hashimoto | 365/185 |
| 5,337,281 | 8/1994 | Kobayashi et al. | 365/218 |
| 5,339,279 | 8/1994 | Toms et al. | 365/185 |
| 5,375,094 | 12/1994 | Naruke | 365/185 |

OTHER PUBLICATIONS

1992 IEEE International Solid-State Circuits Conference, ISSCC 92 Session 9/Non-Volatile and Dynamic RAMS/Paper 9.3, "TP9.3: A 5V-Only 0.6μm Flash EEPROM with Row Decoder Scheme in Triple-Well Structure," Masao Kurlyama, et al., pp. 152–153, 270.

*Primary Examiner*—Joseph E. Clawson, Jr.
*Attorney, Agent, or Firm*—Blakely, Sokoloff, Taylor & Zafman

[57] ABSTRACT

An integrated circuit which provides an arrangement by which the source of voltage for erasing the flash EEPROM memory array is detected and, if the source is a charge pump, the current provided is held to a constant lower value while, if the source is an external high voltage source, then the current is allowed to flow freely without regulation except by the size of a field effect transistor device in the path from the source of voltage to the memory array. In this manner, the circuitry is adapted to function with either internal or external power sources without paying a performance penalty for either type of operation.

16 Claims, 6 Drawing Sheets

METHOD AND APPARATUS FOR CONTROLLING THE OUTPUT CURRENT PROVIDED BY A CHARGE PUMP CIRCUIT

BACKGROUND OF THE INVENTION

1. Field Of The Invention

This invention relates to computer systems and, more particularly, to methods and apparatus for controlling the output current produced by charge pumps used for erasing flash electrically-erasable programable read only memory (flash EEPROM) arrays.

2. History Of The Prior Art

There has been a recent trend toward lowering the power requirements of portable computers. In order to reduce power consumption, much of the integrated circuitry used in personal computers is being redesigned to run at lower voltage levels. The circuitry and components used in portable computers are being designed to operate at voltage levels such as five volts and 3.3 volts. This helps a great deal to reduce the power needs of such computers.

Unfortunately, some features desired in portable computers require higher voltages. Recently, flash electrically-erasable programmable read only memory (flash EEPROM memory) has been used to store basic input/output startup (BIOS) processes for personal computers. This flash EEPROM memory may be erased and reprogrammed without being removed from the computer by running a small update program when the BIOS processes are changed. However, erasing and reprogramming flash EEPROM memory requires approximately twelve volts to accomplish effectively, a voltage not available from the lower voltage batteries provided in personal computers.

In other electronic arrangements, charge pump circuits have been used to provide a high voltage from a lower voltage source. However, even though charge pumps have long been available which are capable of providing the voltages necessary for programming and erasing flash EEPROM memory arrays, no arrangement had been devised until recently for utilizing charge pumps integrated with flash EEPROM memory arrays to provide the voltages needed to accomplish erasing and programming of the flash EEPROM memory arrays using those positive source erase techniques which are used when twelve volts is available from an external source.

The primary reason for the failure is the universal perception that insufficient current can be generated using charge pumps to accomplish the erase process. The positive source method of erasing flash EEPROM memories draws a very substantial amount of current. However, recently it was discovered that using specially designed charge pumps sufficient current could be generated to accomplish positive source erase of flash EEPROM memory arrays. A charge pump arrangement for accomplishing positive source erase is disclosed in detail in U.S. patent application Ser. No. 08/119,719, entitled *Method And Apparatus For Programming And Erasing Flash EEPROM Memory Arrays Utilizing A Charge Pump Circuit*, K. Tedrow et al, filed on even date herewith, and assigned to the assignee of the present invention.

One of the problems encountered in providing charge pumps for generating source voltages for flash EEPROM memory arrays occurs because some manufactures desire to utilize the flash EEPROM arrays in circuitry for which an external power supply is available. This means that the memory array circuitry for providing the source voltage must be capable of utilizing power provided either by its internal charge pumps or by an external source. Typically the current available from an external power source is more than sufficient to erase the memory cells of the array during an erase operation. When provided by an external power source, the amount of current actually available is such that the memory cells are typically moved into a soft breakdown region in which current is dissipated through the source-substrate diode. The current transferred through the source-substrate diode junction is wasted.

However, the current available from the charge pumps is less abundant. There is insufficient current available from charge pumps to erase the memory cells in a time period which is competitive with other forms of memory. For this reason, in order to assure that sufficient current to erase and program the array, it is necessary to assure that current is appropriately utilized so that the dissipation of large mounts of current through the source/substrate diode junction does not occur.

SUMMARY OF THE INVENTION

It is, therefore, an object of the present invention to provide an arrangement for controlling the current provided by a charge pump to a flash EEPROM memory array during erasing of the memory cells without loss of erase performance.

It is another object of the present invention to provide an arrangement for providing current limiting of the current when provided by a charge pump and for eliminating current limiting of the current when provided by an external source of high voltage for erasing flash EEPROM memory arrays.

These and other objects of the present invention are realized in an integrated circuit arrangement which provides an arrangement by which the source of voltage for erasing the flash EEPROM memory array is detected and, if the source is a charge pump, the current provided is held to a constant lower value while, if the source is an external high voltage source, then the current is allowed to flow freely without regulation. In this manner, the circuitry is adapted to function with either internal or external power sources without paying a performance penalty for either type of operation.

These and other objects and features of the invention will be better understood by reference to the detailed description which follows taken together with the drawings in which like elements are referred to by like designations throughout the several views.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to a method for operating a computer in processing electrical or other (e.g. mechanical, chemical) physical signals to generate other desired physical signals.

DETAILED DESCRIPTION

Figure 1:
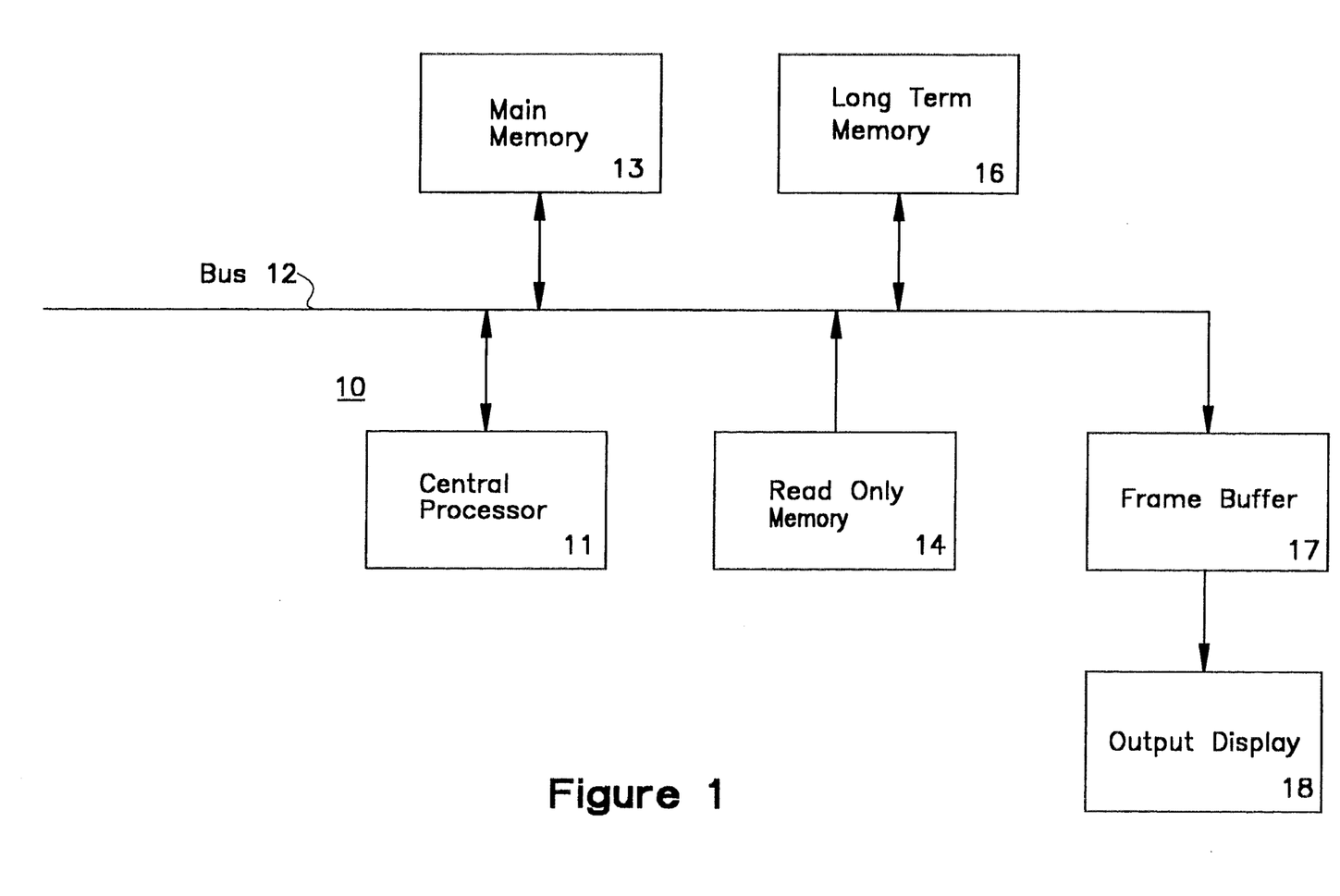
FIG. 1 is a block diagram illustrating a computer system which may utilize the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory. 14. Typically, such flash EEPROM memory will include circuitry for programming and erasing the memory array.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electromechanical hard disk drive, a flash EEPROM memory array may be used as the long term memory 16. Such flash EEPROM memory arrays are programmed and erased through techniques which utilize voltages greater than those typically available to the integrated circuits of more advanced portable computers. Such flash EEPROM memory arrays typically include circuitry for programming and erasing the memory array. Consequently, in accordance with the present invention, such long term memory arrays as well as memory 14 may provide circuitry for generating high voltages from the lower voltages available from the batteries typically utilized with such computers.

A flash EEPROM memory array is made up of memory cells which include floating gate field effect transistor devices. Such memory transistors may be programmed to change the charge stored on the floating gate, and the condition of the transistors (programmed or erased) may be detected by interrogating the cells. The conventional method of erasing an array of flash EEPROM memory cells (called positive source erase) erases all of the cells together (or at least some large block thereof). Typically, this requires the application of twelve volts to the source terminals of all of the memory cells, the grounding of the gate terminals, and the floating of the drain terminals. The programming of memory cells is typically accomplished a word at a time but conventionally requires that the drain of selected cells be placed at six or seven volts, the gate at eleven or twelve volts, and that the source be grounded.

Although it has been typical to provide charge pumps to generate higher voltages when only lower voltages are available, charge pumps which are associated internally with flash EEPROM memory arrays have not been used for erasing and programming flash EEPROM memory arrays using conventional positive source erase techniques. Although such charge pumps are able to raise the voltage to an appropriate level, prior art charge pumps were not felt to provide sufficient current to effectively erase and program flash EEPROM memory when erased in the conventional positive source manner.

A N type flash EEPROM memory cell has a source region which is an N doped region surrounded by a P doped substrate. The P doped substrate is grounded so that a diode junction is formed between the source and the substrate. When twelve volts is placed at the source terminal in the normal positive source erase process where current is furnished from an external source, the diode junction between the source and substrate is biased into the soft breakdown region so that substantial source current flows. Initially this breakdown current is very large, and it may in fact be destructive. Because of this substantial source current when the erase process is conducted using positive source erase with an external power source, the source of the erase voltage must be able to furnish a substantial amount of current when erase was accomplished in this conventional manner. It was not believed by those skilled in the art that a sufficient amount of current could be furnished by a charge pump.

Figure 2:
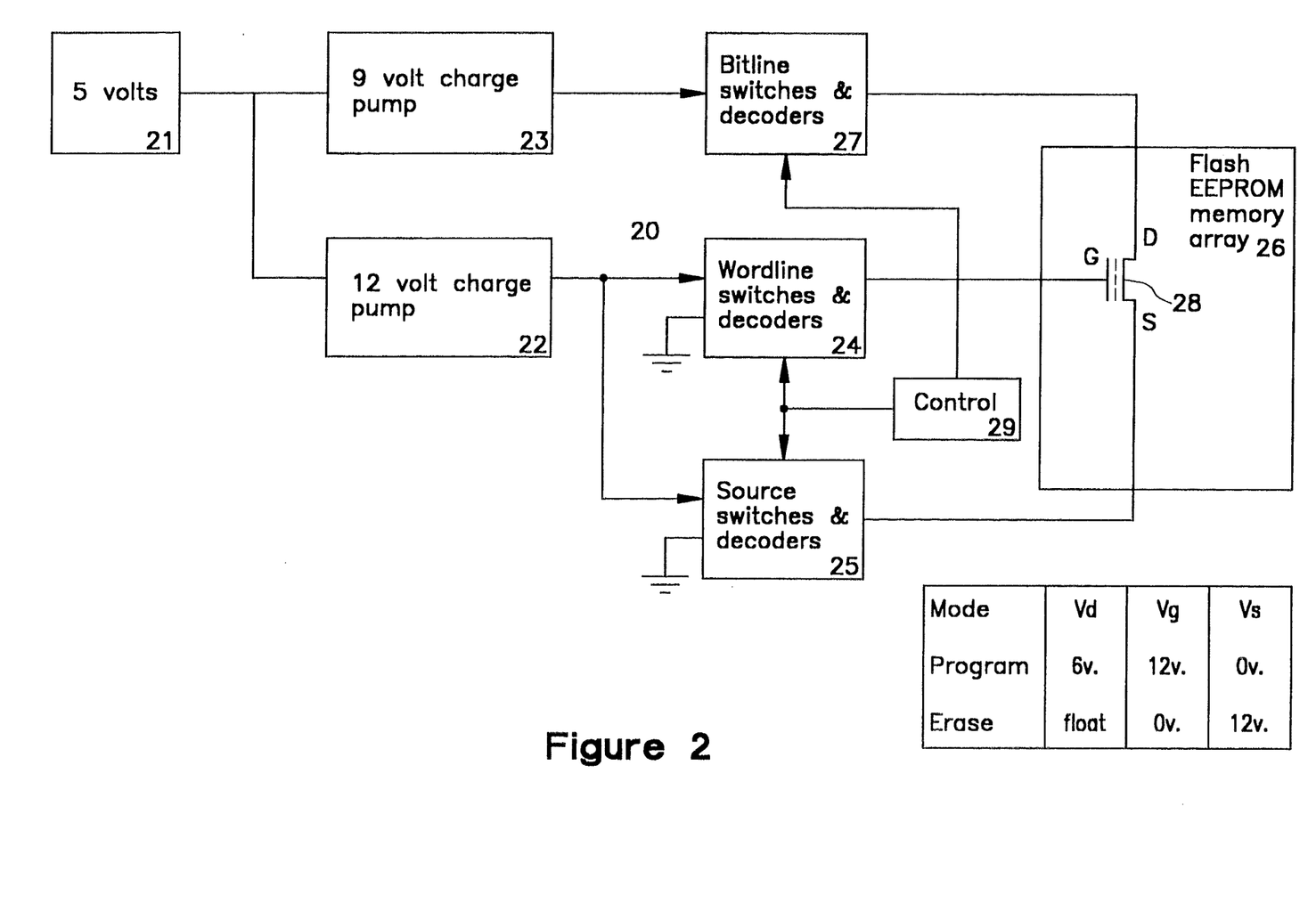
FIG. 2 is a block diagram of a circuit for providing programming and erase voltages for flash EEPROM memory arrays from charge pumps.

FIG. 2 is a block diagram which illustrates an integrated circuit 20 including a flash EEPROM memory array 26 and circuitry for programming and erasing the flash EEPROM memory array 26 utilizing positive source erase techniques and charge pump circuitry. This circuit 20 includes a source of voltage 21 such as a low powered battery capable of furnishing five volts. Voltage from the source 21 is provided to a pair of charge pump circuits 22 and 23. The charge pump circuit 22 is devised to provide a pumped output voltage of approximately twelve volts while the charge pump circuit 23 is devised to produce a pumped output voltage of approximately nine volts.

Voltage from the charge pump 22 is furnished to a set of wordline switches and decoders 24 which, in a manner well known to those skilled in the art, provide voltages at the gate terminals of flash EEPROM memory transistor devices 28 (only one transistor device 28 is illustrated in FIG. 2). Voltage from the pump 22 is also furnished to a set of source switches and decoders 25 which, in a manner well known to those skilled in the art, provide voltages at the source terminals of flash EEPROM memory transistor devices 28. The voltage furnished by the pump 23 is furnished to a set of bitline switches and decoders 27 which, in a manner well known to those skilled in the art, provide voltages at the drain terminals of flash EEPROM memory transistor devices 28. Each of the sets of switches and decoders 24, 25, and 27 is controlled by signals from a control circuit 29 to provide appropriate voltages at erase and programming to accomplish those results. In one embodiment, the control circuit 29 is a microprocessor designed to provide control of all of the operations of the memory array 26 including reading, programming, and erasing among other things. The use of such a control circuit is described in U.S. patent application Ser. No. 08/086,186, entitled *Flash Memory Array System and Method*, M. Fandrich et al, filed Jun. 30, 1993, and assigned to the assignee of the present invention.

At the lower right corner of FIG. 2 is shown a table which includes the voltages which are typically applied to the various terminals of the memory cells during the program and erase operations using positive source erase techniques. As may be seen, the erasing of the memory device 28 requires that a positive twelve volts be applied to the source terminal of the device 28, ground be applied to the gate terminal, and the drain be floated.

A new voltage pump circuit has been devised which is capable of providing the high voltages and currents which are required to program and erase flash EEPROM memory arrays. U.S. patent application Ser. No. 08/119,423, entitled *Method and Apparatus for A Bootstrap Voltage Pump*, K. Tedrow et al, filed on even date herewith, and assigned to the assignee of the present invention. Such a voltage pump circuit is described in detail hereinafter.

Figure 3:
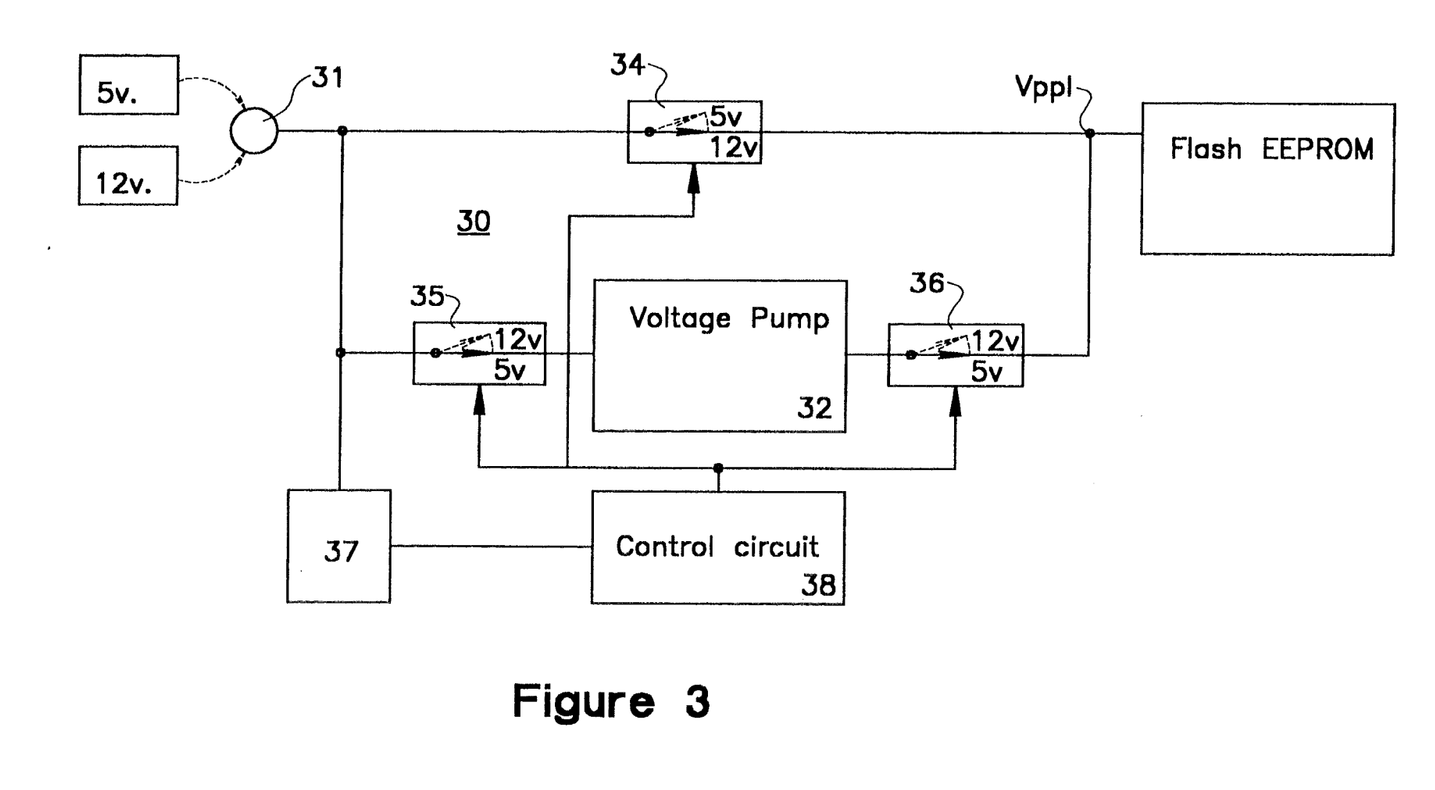
FIG. 3 is a block diagram of a multiplexing arrangement for utilizing both pump current and external current for erasing flash EEPROM memory arrays.

Although the circuit of FIG. 2 allows the use of internal charge pumps to generate voltages for programming and erasing a flash EEPROM memory array, it does not allow the use of an external source of power. FIG. 3 is a block diagram illustrating a circuit arrangement 30 designed in accordance with the present invention which allows switching between an external source and internal charge pumps in order to provide source voltage to operate a flash EEPROM memory array. The arrangement 30 includes a terminal 31 which receives voltage from a source of external voltage. The source of voltage connected to the terminal 31 may be either a twelve volt source capable of furnishing whatever current is necessary for programming and erasing a flash EEPROM memory array. Alternatively, the source of voltage connected to the terminal 31 may be a source of a lower voltage such as five volts which must be used to generate a higher voltage within the circuit arrangement 30. The arrangement 30 also includes a voltage pump circuit 32 designed in accordance with the principles described in the copending patent application to generate from an external voltage of five volts an internal voltage of approximately twelve volts with a current sufficient to erase and program flash EEPROM memory arrays.

Either of the voltages available at the terminal 31 or the voltage pump circuit 32 may be provided to an output terminal designated VppI (internal high voltage) in the figure depending on the availability of the external high voltage source at the terminal 31. If the high voltage external source is available to the computer (or other) system at the terminal 3 1, then a first switch 34 is closed to connect the source at the terminal 31 to the output terminal VppI. Simultaneously, a pair of switches 35 and 36 are each opened to disconnect the voltage pump circuit 32 from the output terminal VppI. If the source of high voltage is not available, then the switch 34 is opened while the switches 35 and 36 are closed to connect the voltage pump circuit 32 to the output terminal VppI and to the input terminal 31 at which the lower voltage is available.

In order to test the presence of the high voltage at the terminal 31, a test circuit 37 is provided. The circuit 37 is a voltage level detector which monitors the value of the voltage available at the terminal 31 and controls the closure of the switches 34, 35 and 36 which connect the different sources to the output terminal VppI. The circuit 37 may be designed in a manner well known to those skilled in the art to produce a voltage level detector. For example, one circuit which may be utilized for this purpose is described in detail in U.S. patent application Ser. No. 08/003,618, entitled *Circuitry For Power Supply Voltage Detection and System Lockout For a Nonvolatile Memory*, M. Landgraf, filed Jan. 13, 1993, and assigned to the assignee of the present invention. If the voltage is at the high level, then the circuit 37 causes a controller circuit 38 to operate the switches in the manner discussed in order to provide the correct voltage from the terminal 31 at the output terminal VppI. If on the other hand, the voltage at the terminal 21 is the lower level (e.g., five volts), then the circuit 37 provides signals to cause the controller 38 to operate the switches 34, 35, and 36 to connect the output of the voltage pump source 32 to the output terminal VppI.

If the controller circuit 38 is an integrated microprocessor as described in the copending application *Flash Memory Array And Method*, it may be programmed to respond to particular control signals to provide signals to close particular switching devices such as the switches 34, 35, and 36 used in the circuit arrangement 31. It should be noted that it is not necessary to include a device as powerful as the microprocessor of the preferred embodiment in order to response to a signal from the circuit 37 and operate the switches 34, 35, and 36 in the manner described above; any number of other controlling circuits will occur to those skilled in the art to accomplish this purpose.

Figure 4:
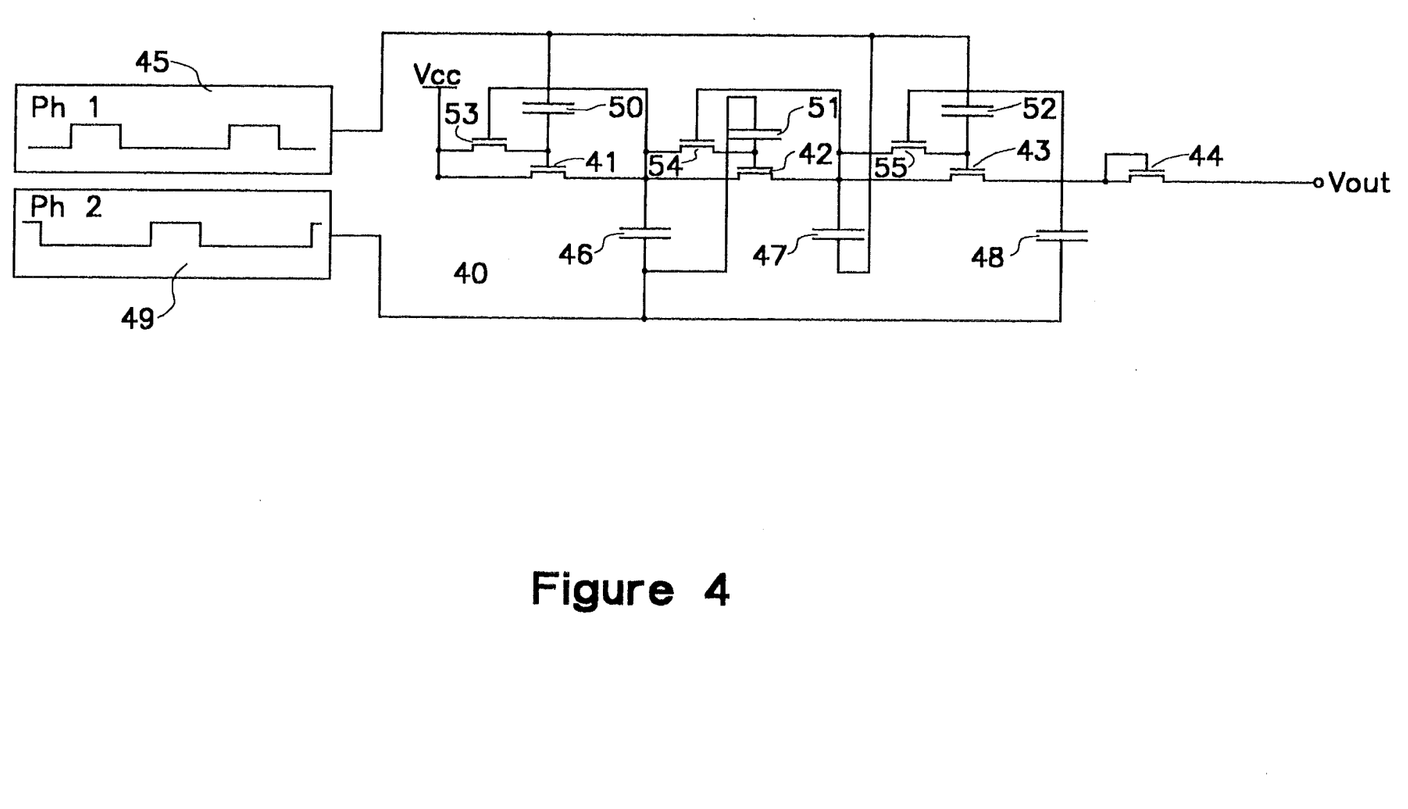
FIG. 4 is a block diagram of a charge pump which may be used in the circuit of FIG. 2 to provide voltages and currents sufficient for positive source erase techniques.

FIG. 4 illustrates a bootstrap pump arrangement 40 as described in the aforementioned copending patent application which may be utilized to provide the high voltages and currents required for erasing and programming flash EEPROM memory arrays in accordance with this invention. As is shown in FIG. 4, the pump 40 includes a number of stages of N type field effect transistor devices 41, 42, 43, and 44 each having drain and source terminals connected in series between a source of voltage Vcc and an output terminal Vout. Input clock signals are furnished to the circuit 40 from a source of clock signals 49 via capacitors 46, 51, and 48. A second set of input clock signals are furnished from a source of clock signals 45 by capacitors 50, 47, and 52. Each stage of the circuit 40 includes an N channel field effect transistor device 53, 54, or 55 providing a path between source and drain terminals to the gate terminal of the associated device 41, 42, or 43 of that stage.

The two phases of input clock pulses (phase 1 and phase 2) produced by the sources 45 and 49 are applied in a unique manner in order to allow the operation of the circuit 40 to produce the desired output voltages and currents.

The details of the construction and operation of the charge pump circuit illustrated in FIG. 4 are provided in the copending patent application referred to above entitled *Method and Apparatus for A Bootstrap Voltage Pump*. The essence of the operation of the charge pump is as follows. When the phase 1 clock goes high, the device 41 turns on; and current provided by the source Vcc charges the capacitor 46. When the phase 1 pulse goes low the device 41 switches off. Then the phase 2 clock pulse turns on the device 42; and the capacitor 46 provides stored charge and charge due to the phase 2 pulse to the capacitor 47. The device 42 switches off when the phase 2 pulse goes low. When the phase 1 pulse again goes high, the source Vcc again charges the capacitor 46. Simultaneously, the device 43 goes on and the capacitor 47 provides stored charge as well as the pulse from the phase 1 clock to charge a capacitor 48. When the phase 1 clock goes low, the device 43 turns off.

Ultimately, the charging of the capacitor 48 and the positive swing of the phase 2 clock pulse raise the voltage level on the capacitor 48 sufficiently above the level Vout to cause the conduction of the switching device 44. When the phase 2 clock goes high, the output device 44 turns on and furnishes a pumped voltage at Vout. A major advantage of the charge pump circuit illustrated is that in operation none of the stages except the last stage operates in a range in which it exhibits a Vt drop. Thus, the charge pump provides almost twice the current to the output terminal as do prior art charge pump circuits.

Thus, the charge pump provides the desired output voltage while furnishing a high level of current necessary to erase and program flash EEPROM memory arrays. The three stage pump circuit 40 illustrated in FIG. 4 furnishes approximately N (where N is the number of stages) plus one times the voltage of the source Vcc at the output terminal less the Vt drop of the device 44. For example, with Vcc equal to 4.4 volts, an output voltage of 17.1 volts is furnished at the output of the pump circuit 40. Thus, as may be seen, the arrangement of FIG. 4 provides a reliable charge pump circuit capable of producing high levels of current.

It should be noted that the smaller charge pump 23 of FIG. 2 required to furnish the voltage used at the drain terminals of the flash EEPROM memory cells during programing of the array may be provided by charge pumps similar to the pump described in FIG. 4 with the exception that fewer stages are used. For example, a charge pump having only two stages is capable of providing a 9.5 volt output which may be used at the drain terminals of the memory cells during programming.

Figure 5:
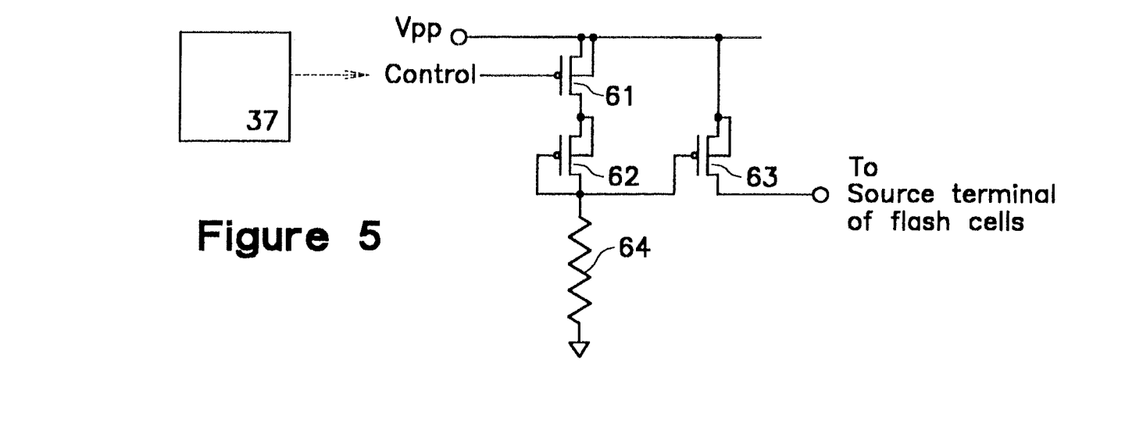
FIG. 5 is a diagram of a first circuit in accordance with the present invention for controlling the output current of a charge pump such as that illustrated in FIG. 4.

Because the charge pump circuits described do not provide an overabundance of current for programing and erasing the memory array, an arrangement has been devised in accordance with the present invention. FIG. 5 illustrates a first circuit by which current provided by a charge pump such as that illustrated in FIG. 4 may be limited to a constant lower value while current provided by an external source which may furnish essentially unlimited amounts of current is not limited. By this arrangement the peak current transferred by the source/substrate diode is kept to a much lower value when current is furnished by a charge pump than when current is furnished by an external power source. The circuit of FIG. 5 includes a first P type field effect transistor device 61 having its source terminal connected to the source of the voltage Vpp to be applied to the source terminals of the memory cells of the array. The gate of the device 61 is connected to receive an input control signal which may be furnished by the voltage detector circuit 37 illustrated in FIG. 3 which detects whether the array is receiving voltage from an external source or pumping voltage for erasing the array. The drain terminal of the device 61 is joined to the source terminal of a second P type field effect transistor device 62. The device 62 has its gate and drain terminals connected together and to a large (e.g., one-half megohms) resistor 64. The resistor 64 is in turn connected to ground. The gate terminal of a third P type field effect transistor device 63 is joined to the gate and drain of the device 62 while the source terminal of the device 63 is connected to the source which supplies the erase voltage Vpp to the source terminals of the flash EEPROM memory cells. The drain of the device 63 is then joined to the array to allow the voltage Vpp to be applied to the source terminals of the flash EEPROM memory cells during erase.

Figure 7:
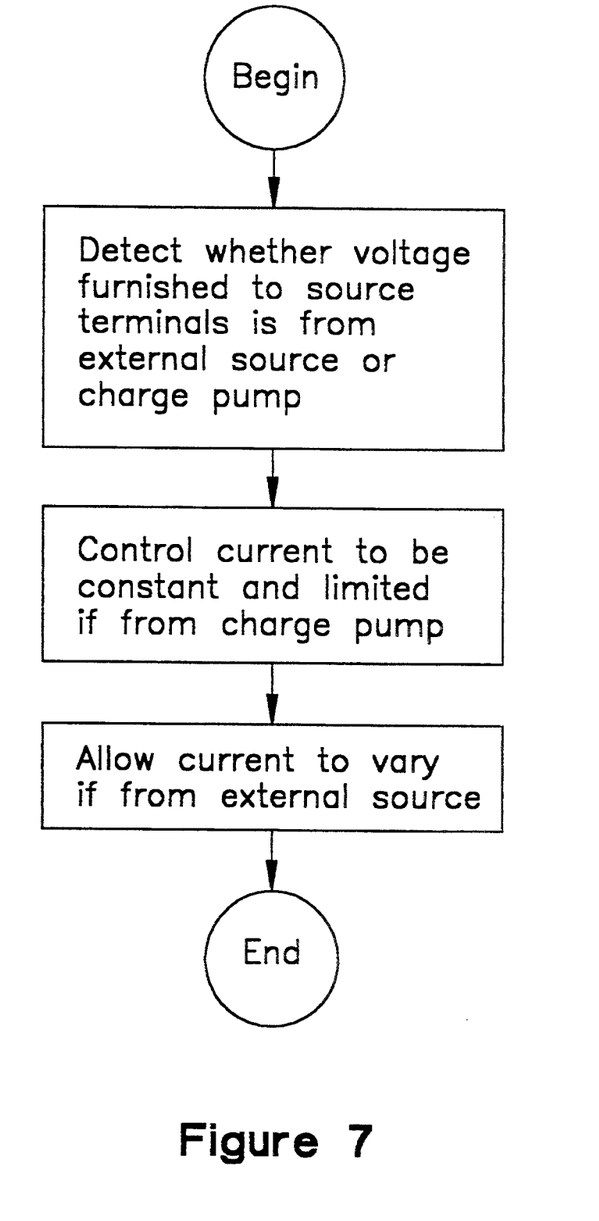
FIG. 7 is a flow chart illustrating a method of practicing the present invention.

FIG. 7 is a flow chart which describes a method of operation of the invention shown in FIG. 5. In the circuit of FIG. 5, when ground (a zero valued signal) is furnished from the detector circuit 37 to signify that an external power supply of five volts is being furnished and is pumped to provide the voltage Vpp, the device 61 switches on and applies a voltage of Vpp at the source terminal of the device 62. The device 62 has its drain and gate terminals connected to ground through the resistor 64. Consequently, the device 62 turns on and operates in its saturation region causing current to flow from the source Vpp through the device 61, the device 62, and the resistor 64 to ground. Since the resistor 64 is a large value, it controls the current through the device 62 to be a constant limited value. The voltage at the gate and drain of the P device 62 is applied at the gate of the P device 63 turning on the device 63 and mirroring the current through the device 62. This current is furnished to the source terminals of the flash cells being erased. This current is limited by choice of device size and the resistance value to a value such that the flash cells receive sufficient current to erase without receiving a peak current capable of pushing the cells so far into the soft breakdown region that there is insufficient switching current to accomplish the positive source erase.

When a one valued signal is furnished from the detector circuit 37 to signify that an external power supply of twelve volts is being furnished to provide the voltage Vpp, the device 61 turns off. Consequently, no current flows through the device 62, and the gate terminal of the device 63 is held at ground through the resistor 64. This places the device 63 in an operating region in which all of the current available from the external source of the voltage Vpp may be furnished to the flash EEPROM memory cells and they may be erased in the conventional manner by transition into the soft breakdown region. In this case, the amount of current which may be transferred is limited by the sizing of the P device 63.

Figure 6:
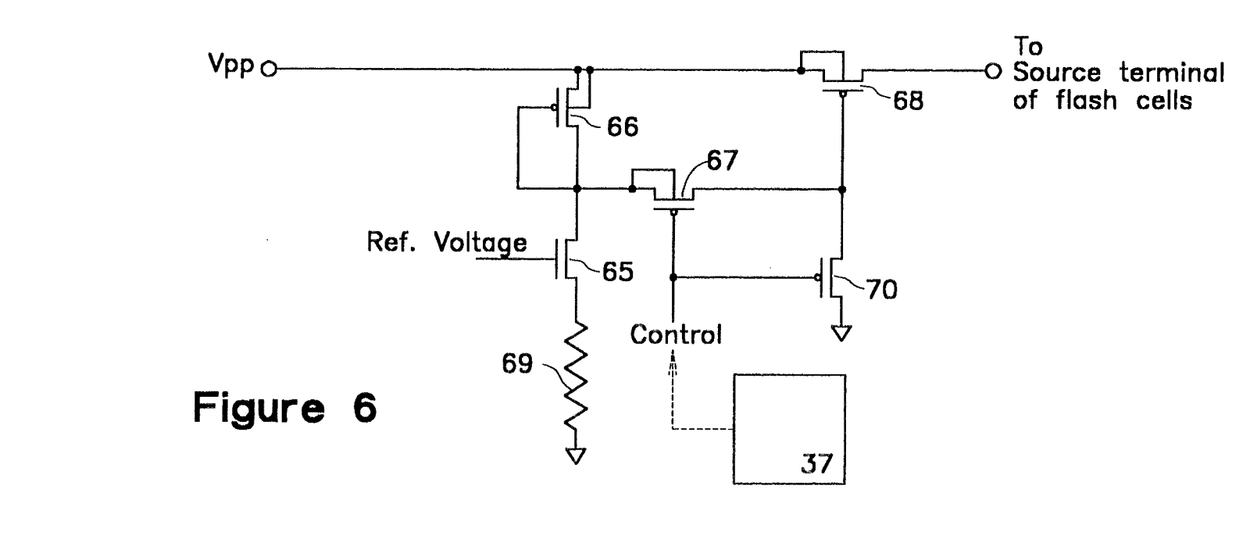
FIG. 6 is a block diagram of a second circuit in accordance with the present invention for controlling the output current of a charge pump such as that illustrated in FIG. 4.

FIG. 6 illustrates a second circuit which performs the same function of allowing all of the current provided by an external source to be transferred to the source terminals of a flash EEPROM memory array while limiting the current available from an internal charge pump like that described above to a lesser and constant value. The circuit of FIG. 6 includes a first P type field effect transistor device 66 having its source terminal connected to the source of the voltage Vpp to be applied to the source terminals of the memory cells of the array. The device 66 has its gate and drain terminals connected to the source terminal of a second P type field effect transistor device 67 and to the drain of an N type field effect transistor device 65. The N device 65 has its source terminal connected to ground through a large resistor 69. The gate of the N device 65 is connected to receive a reference voltage which remains constant throughout operation of the circuit of FIG. 6. The gate of the device 67 is connected to receive the input control signal which may be at a zero or a twelve volt level and may be furnished by the voltage detector circuit 37 illustrated in FIG. 3 which detects whether the array is receiving voltage from an external source or pumping voltage for erasing the array. The drain terminal of the device 67 is joined to the gate terminal of a third P type field effect transistor device 68. The device 68 has its source and drain terminals connected in series in a path between the source of the voltage Vpp and the source terminals of the array.

Also connected to receive the control signals provided by the voltage detector circuit 37 which detects whether the array is receiving voltage from an external source or pumping voltage for erasing the array is a N type field effect transistor device 70. The device 70 receives the control signals at its gate terminal while its source terminal is connected to ground and its drain terminal to the gate terminal of the device 68.

In operation (which is illustrated in the flow chart of FIG. 7), the detector provides a zero valued signal when the source voltage Vpp is provided by the internal charge pumps. This value is applied to the gate of the N device 70 and the gate of the P device 67. The zero value disables the N device 70. The device 66 is so biased that it turns on and conducts in the saturated rage. This provides a voltage value at the drain of the device 67 which is somewhat less than the voltage Vpp. Since the N device 65 has a constant reference voltage at its gate terminal, it is on constantly and transfers a current controlled by the resistor 69. The large value of the resistor 69 controls the current through the device 66 to remain constant.

The voltage Vpp at the source of the device 66 less the Vt drop across the device 66 is also applied at the source of the device 67. The voltages at the source and gate of the device 67 turn it on in a region of operation in which it exhibits essentially no Vt drop causing the voltage Vpp less the Vt drop of the device 66 to be applied at the gate of the device 68. With the gate and source terminals of each of the devices 66 and 68 being at the same values, the device 68 conducts mirroring the constant current through the device 66. In one embodiment, the device 68 has a channel width which is twenty-five times that of the device 66 so that it transfers twenty-five times the constant current transferred by the device 66, a current which remains constant no matter what current is furnished at the source of the voltage Vpp. Thus, when the detector 37 signals that the charge pump is providing the source voltage, the current provided is limited to a constant value. This value is selected to be such that the peak current applied to the memory devices of the flash EEPROM array moves those devices into a portion the soft breakdown region so that too much current is not dissipated by transfer through the diode action of the source to substrate junction.

On the other hand, when the detector determines that the external source is providing voltage for erasing the array, a one valued or high signal of twelve volts is provided at the control terminal. This signal disables the device 67 and enables the N type device 70. The device 70 conducts and ground is applied at the gate terminal of the device 68. Ground at the gate of the device 68 causes the device 68 to operate in the region in which it transfers current limited only by the size of the device 68 to the source terminals of the memory cells of the flash EEPROM array.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit comprising:
   a memory array comprising a plurality of floating gate field effect transistor devices including a gate terminal, a drain terminal and a source terminal;
   a charge pump circuit for generating a positive voltage for source terminals of said floating gate field effect transistor devices during an erase operation;
   a first terminal for receiving power from an external source;
   a switch circuit coupled to said charge pump circuit and to said first terminal for selectively supplying power for an erase operation from either said terminal or said charge pump circuit to a second terminal; and
   a control circuit coupled to said second terminal to receive said power for regulating current to a first constant current when said power is supplied from said charge pump circuit, and for not regulating current when said power is supplied from said external source, said first constant current being insufficient to bias a floating gate field effect transistor devices in a soft breakdown region during an erase operation.

2. The circuit as set forth in claim 1, wherein said control circuit comprises:
   a constant current source coupled to said second terminal including at least one control transistor for receiving a control signal, said control transistor being biased to activate said constant current source when said power is selectively supplied from said charge pump circuit, and being biased to inactivate said constant current source when said power is selectively supplied from said external source; and
   a first transistor coupling said second terminal to selective source terminals of said floating gate field effect transistor devices during an erase operation, said first transistor being biased by said constant current source so as to regulate current in said first transistor to generate said first constant current.

3. The circuit as set forth in claim 22, wherein:
   said control transistor comprises a first diode connected p-channel field effect transistor;
   said constant current source comprises a second diode connected p-channel field effect transistor coupled in series with said first p-channel field effect transistor, and a resistor coupling the drain of said first p-channel field effect transistor to ground; and
   said second transistor comprises a third diode connected p-channel field effect transistor, wherein the drain of said second p-channel transistor is coupled to the gate of said third p-channel transistor.

4. The circuit as set forth in claim 2, wherein:
   said at least one control transistor comprises a first diode connected p-channel field effect transistor and a second p-channel field effect transistor;
   said constant current source comprises:
      a first n-channel field effect transistor being biased by a constant reference voltage;
      a resistor coupled between the source of said first n-channel field effect transistor and ground;
      a third diode connected p-channel field effect transistor coupled between said second terminal and said first n-channel field effect transistor; and
   said second transistor comprises a fourth diode connected p-channel field effect transistor being coupled to said first and second p-channel transistors to provide said constant current when said first and second p-channel field effect transistors are biased with said control signal.

5. The circuit as set forth in claim 1, further comprising a detector circuit, coupled to said first terminal, for detecting whether a positive voltage sufficient for said erase operation is present at said first terminal, and for generating a control signal indicating whether said positive voltage is present.

6. A memory comprising:
   storage means for storing data, said storage means comprising a plurality of floating gate field effect transistor devices including a gate terminal, a drain terminal and a source terminal;
   charge pump means for generating a positive voltage for source terminals of said floating gate field effect transistor devices during an erase operation;
   first terminal means for receiving power from an external source;
   switching means coupled to said charge pump means and to said first terminal means for selectively supplying power for an erase operation from either said terminal or said charge pump means to a second terminal means; and
   control means coupled to said second terminal to receive said power for regulating current to a first constant current when said power is supplied from said charge pump means, and for not regulating current when said power is supplied from said external source, said first constant current being insufficient to bias a floating gate field effect transistor devices in a soft breakdown region during an erase operation.

7. The memory as set forth in claim 6, wherein said control means comprises:
   constant current source means coupled to said second terminal means including at least one control switching means for receiving a control signal, said control switching means being configured to activate said constant current source when said power is selectively supplied from said charge pump means, and being configured to inactivate said constant current source when said power is selectively supplied from said external source; and
   a first switching means coupling said second terminal means to selective source terminals of said floating gate field effect transistor devices during an erase operation, said first switching means being configured by said constant current source so as to regulate current in said first switching means to generate said first constant current.

8. The memory as set forth in claim 7, wherein:
   said control switching means comprises a first diode connected p-channel field effect transistor;
   said constant current source means comprises a second diode connected p-channel field effect transistor coupled in series with said first p-channel field effect transistor, and a resistor coupling the drain of said first p-channel field effect transistor to ground; and
   said first switching means comprises a third diode connected p-channel field effect transistor, wherein the drain of said second p-channel transistor is coupled to the gate of said third p-channel transistor.

9. The memory as set forth in claim 7, wherein:
   said control switching means comprises a first diode connected p-channel field effect transistor and a second p-channel field effect transistor;
   said constant current source means comprises:
      a first n-channel field effect transistor being biased by a constant reference voltage;
      a resistor coupled between the source of said first n-channel field effect transistor and ground;
      a third diode connected p-channel field effect transistor coupled between said second terminal and said first n-channel field effect transistor; and
   said first switching means comprises a fourth diode connected p-channel field effect transistor being coupled to said first and second p-channel transistors to provide said constant current when said first and second p-channel field effect transistors are biased with said control signal.

10. The memory as set forth in claim 6, further comprising detector means, coupled to said first terminal means, for detecting whether a positive voltage sufficient for said erase operation is present at said first terminal means, and for generating a control signal indicating whether said positive voltage is present.

11. A computer system comprising:
   a central processor;
   main memory;
   a non-volatile memory comprising:
      a plurality of floating gate field effect transistor devices including a gate terminal, a drain terminal and a source terminal;
      a charge pump circuit for generating a positive voltage for source terminals of said floating gate field effect transistor devices during an erase operation;
      a first terminal for receiving power from an external source;
      a switch circuit coupled to said charge pump circuit and to said first terminal for selectively supplying power for an erase operation from either said terminal or said charge pump circuit to a second terminal;
      a control circuit coupled to said second terminal to receive said power for regulating current to a first constant current when said power is supplied from said charge pump circuit, and for not regulating current when said power is supplied from said external source, said first constant current being insufficient to bias a floating gate field effect transistor devices in a soft breakdown region during an erase operation; and
   a system bus coupled to said central processor and said non-volatile memory for transferring data and addresses between said central processor and said non-volatile memory.

12. The computer system as set forth in claim 11, wherein said control circuit comprises:
   a constant current source coupled to said second terminal including at least one control transistor for receiving a control signal, said control transistor being biased to activate said constant current source when said power is selectively supplied from said charge pump circuit, and being biased to inactivate said constant current source when said power is selectively supplied from said external source; and
   a first transistor coupling said second terminal to selective source terminals of said floating gate field effect transistor devices during an erase operation, said first transistor being biased by said constant current source so as to regulate current in said first transistor to generate said first constant current.

13. The computer system as set forth in claim 12, wherein:
   said control transistor comprises a first diode connected p-channel field effect transistor;
   said constant current source comprises a second diode connected p-channel field effect transistor coupled in series with said first p-channel field effect transistor, and a resistor coupling the drain of said first p-channel field effect transistor to ground; and
   said second transistor comprises a third diode connected p-channel field effect transistor, wherein the drain of said second p-channel transistor is coupled to the gate of said third p-channel transistor.

14. The computer system as set forth in claim 12, wherein:
   said at least one control transistor comprises a first diode connected p-channel field effect transistor and a second p-channel field effect transistor;
   said constant current source comprises:
      a first n-channel field effect transistor being biased by a constant reference voltage;
      a resistor coupled between the source of said first n-channel field effect transistor and ground;
      a third diode connected p-channel field effect transistor coupled between said second terminal and said first n-channel field effect transistor; and
   said second transistor comprises a fourth diode connected p-channel field effect transistor being coupled to said first and second p-channel transistors to provide said constant current when said first and second p-channel field effect transistors are biased with said control signal.

15. The computer system as set forth in claim 11, further comprising a detector circuit, coupled to said first terminal, for detecting whether a positive voltage sufficient for said erase operation is present at said first terminal, and for generating a control signal indicating whether said positive voltage is present.

16. The computer system as set forth in claim 11, further comprising source switches and decoders coupled to said second terminal, for selecting said floating gate field effect transistor devices for an erase operation.

* * * * *

UNITED STATES PATENT AND TRADEMARK OFFICE
CERTIFICATE OF CORRECTION

PATENT NO. : 5,442,586
DATED : August 15, 1995
INVENTOR(S) : Javanifard et al.

It is certified that error appears in the above-identified patent and that said Letters Patent is hereby corrected as shown below:

In column 1 at line 11 delete "programable" and insert --programmable--

In column 2 at line 22 delete "mounts" and insert --amounts--

In column 8 at line 11 delete "programing" and insert --programming--

In column 8 at line 18 delete "programing" and insert --programming--

In column 10 at line 1 delete "rage." and insert --range.--

In column 11 at line 24 delete "claim 22," and insert --claim 2,--

Signed and Sealed this

Fourteenth Day of January, 1997

Attest:

BRUCE LEHMAN

*Attesting Officer*   *Commissioner of Patents and Trademarks*